(12) United States Patent
Yokogawa et al.

(10) Patent No.: US 8,197,634 B2
(45) Date of Patent: Jun. 12, 2012

(54) PLASMA PROCESSING APPARATUS

(75) Inventors: Kenetsu Yokogawa, Tsurugashima (JP); Tatehito Usui, Kasumigaura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 986 days.

(21) Appl. No.: 11/848,262

(22) Filed: Aug. 31, 2007

(65) Prior Publication Data
US 2008/0289765 A1 Nov. 27, 2008

(30) Foreign Application Priority Data
May 22, 2007 (JP) .................. 2007-135776

(51) Int. Cl.
H01L 21/00 (2006.01)
C23C 16/00 (2006.01)
C23C 14/00 (2006.01)
(52) U.S. Cl. ............... 156/345.24; 156/345.25; 118/712
(58) Field of Classification Search ............. 156/345.25, 156/345.24
See application file for complete search history.

(56) References Cited

U.S. PATENT DOCUMENTS

| | | | | |
|---|---|---|---|---|
| 4,317,698 A | * | 3/1982 | Christol et al. ........... | 216/60 |
| 5,450,205 A | * | 9/1995 | Sawin et al. .............. | 356/632 |
| 6,400,458 B1 | * | 6/2002 | Howald .................... | 356/496 |
| 6,449,038 B1 | * | 9/2002 | Stolze ...................... | 356/316 |
| 6,829,056 B1 | * | 12/2004 | Barnes et al. ............ | 356/625 |

FOREIGN PATENT DOCUMENTS

| | | |
|---|---|---|
| JP | 61-053728 | 3/1986 |
| JP | 61-171130 | 8/1986 |
| JP | 01-231325 | 9/1989 |
| JP | 05136098 A * | 6/1993 |
| JP | 2006-216605 | 8/2006 |

* cited by examiner

*Primary Examiner* — Ram N. Kackar
(74) *Attorney, Agent, or Firm* — Antonelli, Terry, Stout & Kraus, LLP.

(57) ABSTRACT

An arrangement is provided for suppressing interference phenomenon on the surface of a sample that deteriorates the detection accuracy upon detecting the time variation of plasma conditions such as plasma space distribution or the processing status of the sample. For example, light scattering element for diffusing and transmitting incident light and a convex lens are arranged on a front stage of an optical fiber light receiving unit connected to a photodetector disposed on an opposite side from the sample for observing the emission of plasma. This serves to prevent the changes in light quantity accompanying the interference effect caused by the changes in thin film thickness on the surface of the sample from reaching the photodetector. An arrangement is also provided to prevent the light scattering element from being directly exposed to the plasma to prevent alteration of the light scattering element.

21 Claims, 8 Drawing Sheets

PLASMA PROCESSING APPARATUS

The present application is based on and claims priority of Japanese patent application No. 2007-135776 filed on May 22, 2007, the entire contents of which are hereby incorporated by reference.

BACKGROUND OF THE INVENTION

1. Field of the Invention

The present invention relates to a semiconductor manufacturing apparatus for manufacturing semiconductor devices such as various semiconductor memories and central processing units, and more specifically, relates to a plasma processing apparatus for etching the surface of a sample to be processed which is a semiconductor substrate such as silicon using plasma to create a pattern illustrated thereon via lithography technique, so as to form a desired shape on the surface of the semiconductor substrate.

2. Description of the Related Art

Semiconductor devices are manufactured in a plasma processing apparatus by etching the surface of semiconductor substrates using plasma to the shapes of patterns illustrated thereon via lithography technique. In the current state, it is necessary to form patterns with processing dimensions in the order of tens of nm smaller than 0.1 μm via the plasma process, which requires a processing accuracy of a few nm in the order of atomic and molecular sizes. It is predicted that the demand of processing accuracy will become more and more severe in the future. In order to realize such severe processing accuracy with high reproducibility, the plasma conditions must have high stability and reproducibility, and the processing conditions must be controlled through accurate recognition of the progress status of the etching process. In the prior art, accuracy was achieved by accurately reproducing plasma generating parameters such as electromagnetic wave power for discharge, material gas flow rate, material gas pressure and wafer bias power, which are plasma generating conditions optimized in advance. Recently, as disclosed in Japanese Patent Application Laid-Open Publication No. 2006-216605 (patent document 1), in order to realize an even higher processing accuracy, the plasma conditions is observed and the change in status thereof is used to perform feedback control of the plasma generating parameters by which a higher stability is achieved. Moreover, Japanese Patent Application Laid-Open Publication Nos. 61-171130 (patent document 2), 61-53728 (patent document 3) and 1-231325 (patent document 4) disclose observing the processing status of the surface of the sample to be processed via spectroscopic analysis of plasma emission, monitoring the end point and the like of etching and performing accurate process progress control so as to stabilize the processing accuracy.

In order to improve the processing accuracy of the etching process using plasma, it is inevitable to recognize the plasma conditions by monitoring the plasma emission and to perform plasma control by recognizing the status of progress of etching, as described above. It is advantageous to observe the plasma emission from an opposite side from the sample to be processed from viewpoints of detection sensitivity and the like. Especially, it is inevitable to perform observation from the opposite side from the sample to be processed in order to monitor the plasma distribution in real time using the plurality of photodetecting means as disclosed in patent document 1. However, multiple layers of thin films are formed on the silicon substrate which is the surface of the sample to be processed, and plasma emission is reflected by the multiple thin film layers causing interference thereof, so that the change in emission intensity accompanying this interference phenomenon is detected if emission is detected at the opposite side from the sample to be processed, according to which the change in emission intensity intrinsic to plasma cannot be monitored accurately and the control accuracy is deteriorated.

SUMMARY OF THE INVENTION

The present invention aims at providing a means for suppressing the interference phenomenon occurring at the surface of the sample to be processed that deteriorates the detection accuracy upon detecting the time variation of the plasma conditions such as spatial distribution of plasma and the processing status of the sample to be processed in a plasma processing apparatus. Furthermore, the present invention aims at providing a highly accurate plasma conditions monitor.

The present invention provides an arrangement comprising a means for extracting plasma emission at an opposite side from the sample to be processed, and a light transmission means for scattering and transmitting incident light into the means for extracting plasma emission, or a light transmission means for scattering and transmitting incident light having an uneven surface of 5 μm or greater and 200 μm or smaller.

The interference by reflected light at the surface of the sample to be processed is caused by light wave surfaces having different phase differences reflected on the multiple thin film interfaces being synthesized in the light detecting unit. The light transmission means for scattering or diffusing light used in the present invention has an uneven surface formed to have a greater pitch than the wavelength of light. Thus, when the light wave surfaces reflected by the multiple thin film interfaces on the sample to be processed and having phase differences reach the uneven surface, the light wave surfaces are subjected to phase synthesis at various portions of the uneven surface, so that by observing an area of a certain size, the change in emission intensity caused by the interference effect is averaged and suppressed. By this effect, it becomes possible to reduce the effect of interference even by observing plasma emission at the opposite side from the sample to be processed which is preferable from viewpoints of advantageous sensitivity and easy recognition of plasma distribution, and it becomes possible to accurately detect the intrinsic change of plasma emission. Thereby, it becomes possible to accurately recognize the change in plasma conditions and the processing status of the sample to be processed, by which the plasma control accuracy can be improved, and as a result, the processing accuracy and reproducibility of the plasma etching process can be improved.

According to the present invention, it becomes possible to highly accurately observe the emission status of plasma without being influenced by the change in status of the surface of the sample to be processed, and to achieve detection of variation of processing property accompanying the time variation of plasma and to correct the same with high accuracy. Similarly, the accuracy of observation of the processing status such as the end point determination of etching using the observation result of active species of plasma by spectroscopic analysis of plasma emission can be improved, and as a result, the processing accuracy and the reproducibility can be improved.

DETAILED DESCRIPTION OF THE PREFERRED EMBODIMENTS

Embodiment 1

Figure 1:
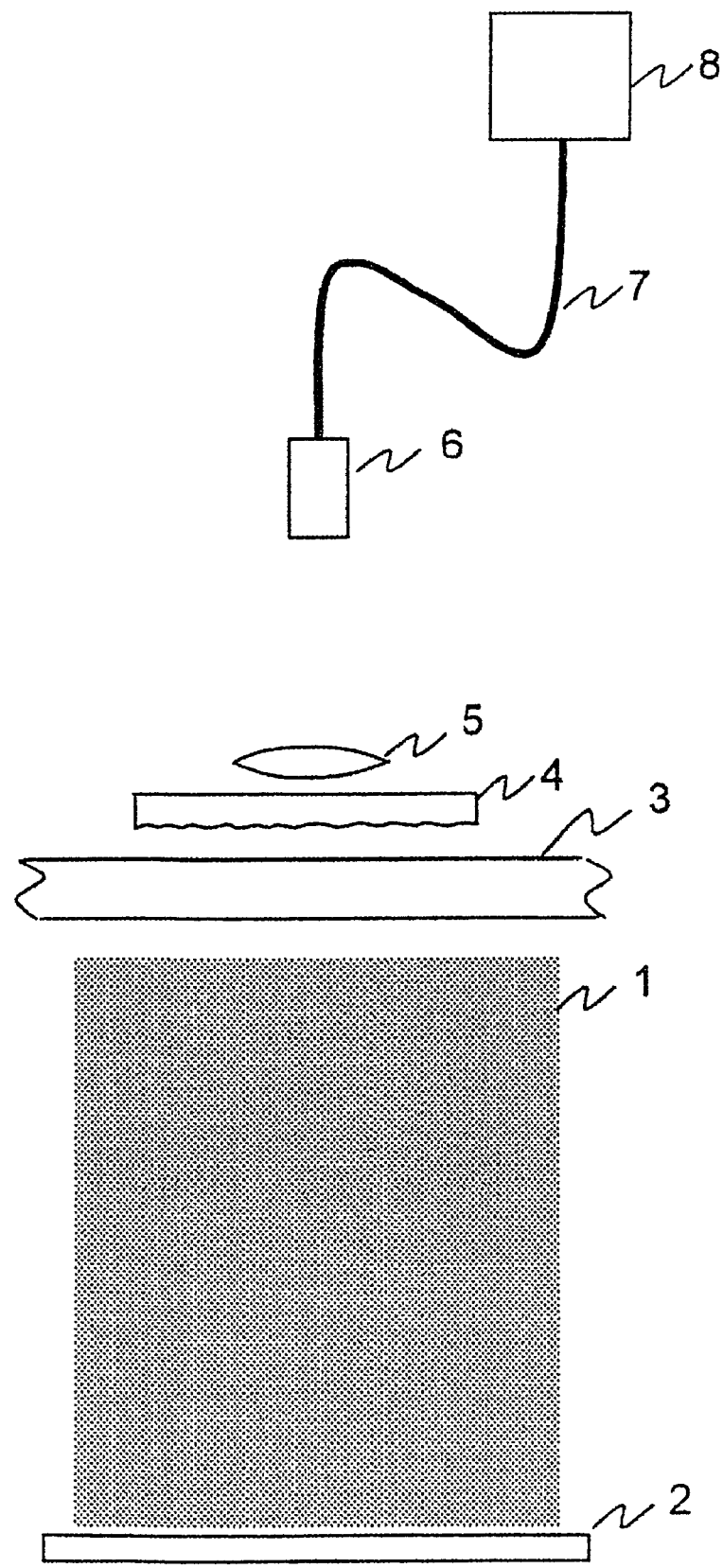
FIG. 1 illustrates a first preferred embodiment of the present invention.

The arrangement of an apparatus according to a first embodiment of the present invention will be shown in FIG. 1. In the arrangement of FIG. 1, a vacuum partition window 3, a light scattering element 4, a convex lens 5 and an optical fiber light receiving unit 6 are arranged at an opposite side from a sample 2 to be processed via plasma 1. The light conducted via an optical fiber 7 to the optical fiber light receiving unit 6 is transmitted to a photodetector 8, which is an optical power detector such as a photodiode or an optical power detector connected via a spectrometer connected to a rear stage thereof, and converted into an electric signal, based on which the plasma emission quantity or the plasma emission components are detected.

Figure 2:
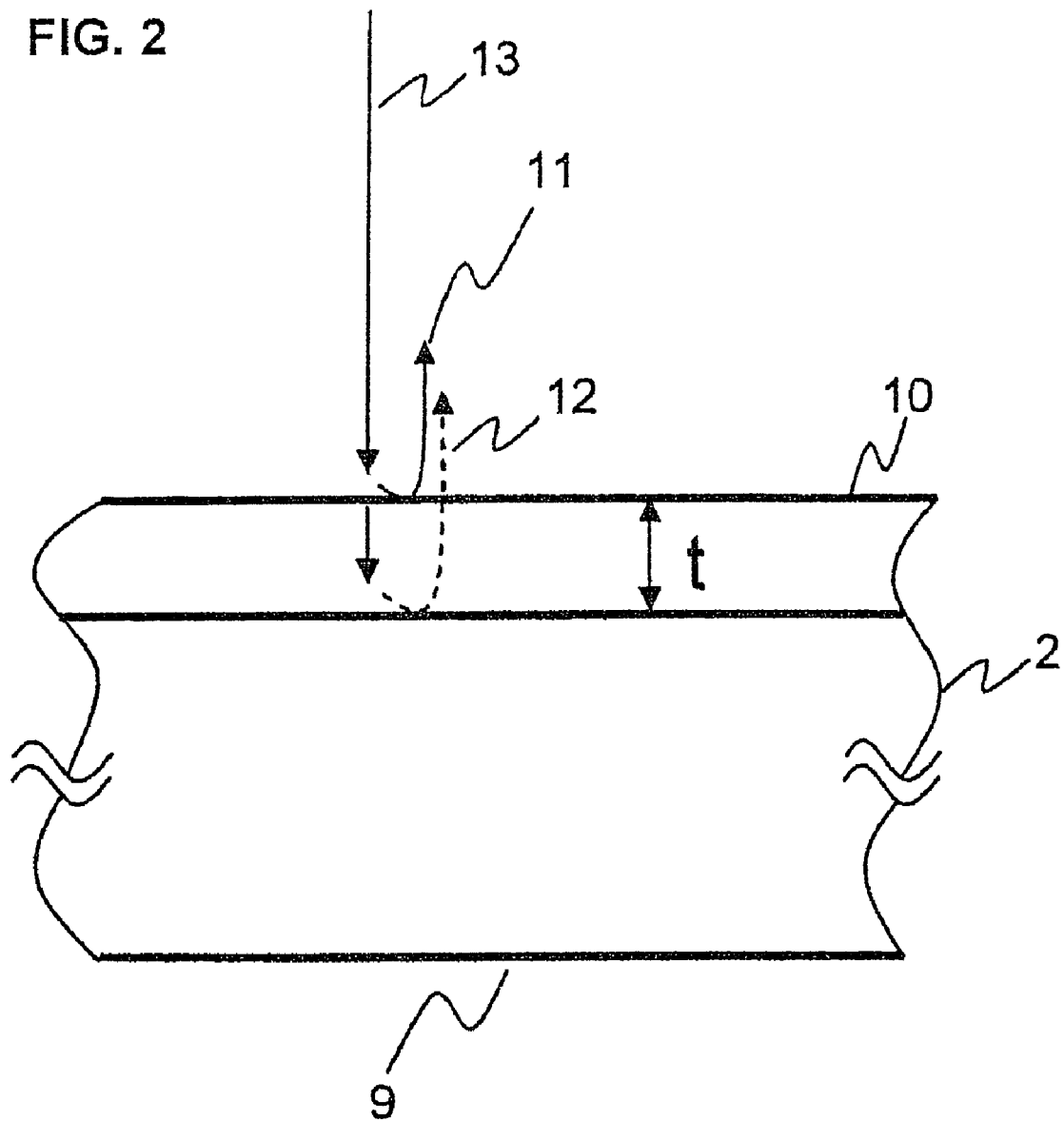
FIG. 2 is a first explanatory view showing the light interference effect by thin films formed on the surface of a sample to be processed.

Prior to describing the operation of FIG. 1, we will first describe the interference effect with respect to FIG. 2. FIG. 2 illustrates the reflection of plasma emission on the surface of a sample 2 to be processed having a silicon oxide film 10 formed on top of a silicon substrate 9. As illustrated in FIG. 2, the light being incident on the sample 2 to be processed is reflected on both the surface of the silicon oxide film 10 and the interface with the silicon substrate 9, and the optical path difference (which, in the case of vertical incidence, is two times the film thickness t) caused by these reflections creates a phase difference between the first reflected light A11 and the second reflected light B12.

Figure 3:
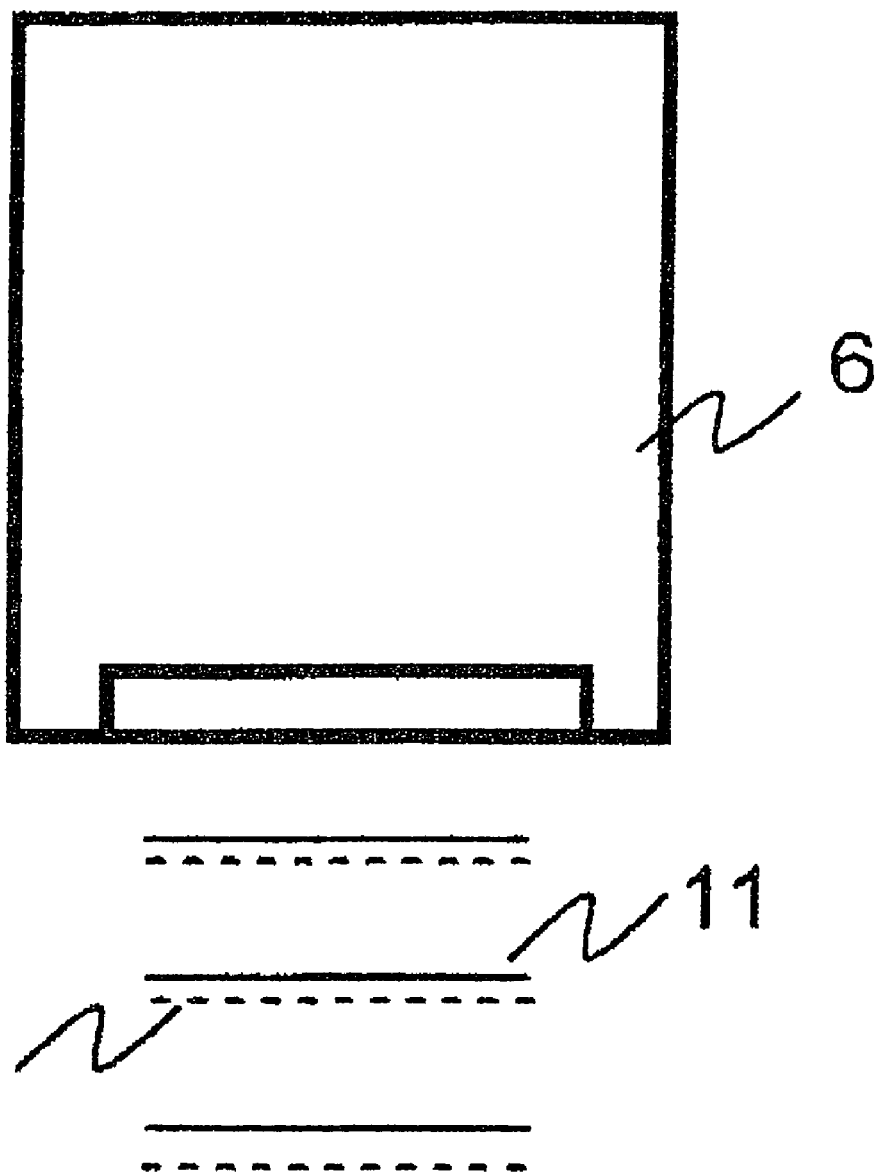
FIG. 3 is a second explanatory view showing the light interference effect by thin films formed on the surface of a sample to be processed.

As typically shown in FIG. 3, if the first reflected light A11 and the second reflected light B12 maintains the above-mentioned phase difference when reaching the photodetector 8 or the optical fiber light receiving unit 6 which conducts the light to the photodetector 8, phase synthesis occurs and interference is caused. By this interference effect, along with the change in thickness t of the silicon oxide film 9 that accompanies the plasma processing, the light quantity detected by the photodetector 8 is varied. The photodetector 8 also detects the light being incident directly from the plasma other than the reflected light with the phase difference illustrated in FIGS. 2 and 3, and essentially, is aimed to detect the change in the light quantity being incident directly from the plasma so as to observe the changes in plasma conditions. However, even if the light quantity of the direct incident plasma light is unchanged, the change in light quantity caused by the interference effect is detected by the photodetector 8, making it difficult to measure the true change in plasma light quantity in an accurate manner. One method for excluding the influence of the interference effect for observing the plasma emission is to observe the plasma emission from a direction parallel to the surface of the sample to be processed. However, if multiple photodetecting means are arranged above the surface of the sample to be processed to observe the plasma emission distribution above the surface of the sample or to simply observe the plasma emission, if there is a strong influence from the reflected light from the vacuum reactor wall, it may become difficult to observe light from the direction parallel to the surface of the sample to be processed. Therefore, an accurate measurement means for measuring the plasma emission intensity through observation at an opposite side from the sample to be processed is required for improving the accuracy of various monitors and the plasma control utilizing such monitors.

Therefore, according to the present invention illustrated in FIG. 1, a light scattering element 4 is arranged near the photodetector 8 or the optical fiber light receiving unit 6 conducting light to the photodetector 8 so as to suppress the change in light receiving quantity accompanying the interference effect caused by the multilayered structure on the surface of the sample 2 to be processed. The light scattering element 4 is a light transmission means that scatters and transmits incident light, which is formed of a material that is substantially transparent with respect to the light to be observed, with an unevenness having a sufficiently large pitch with respect to the wavelength of light to be observed formed to the surface thereof.

Figure 4:
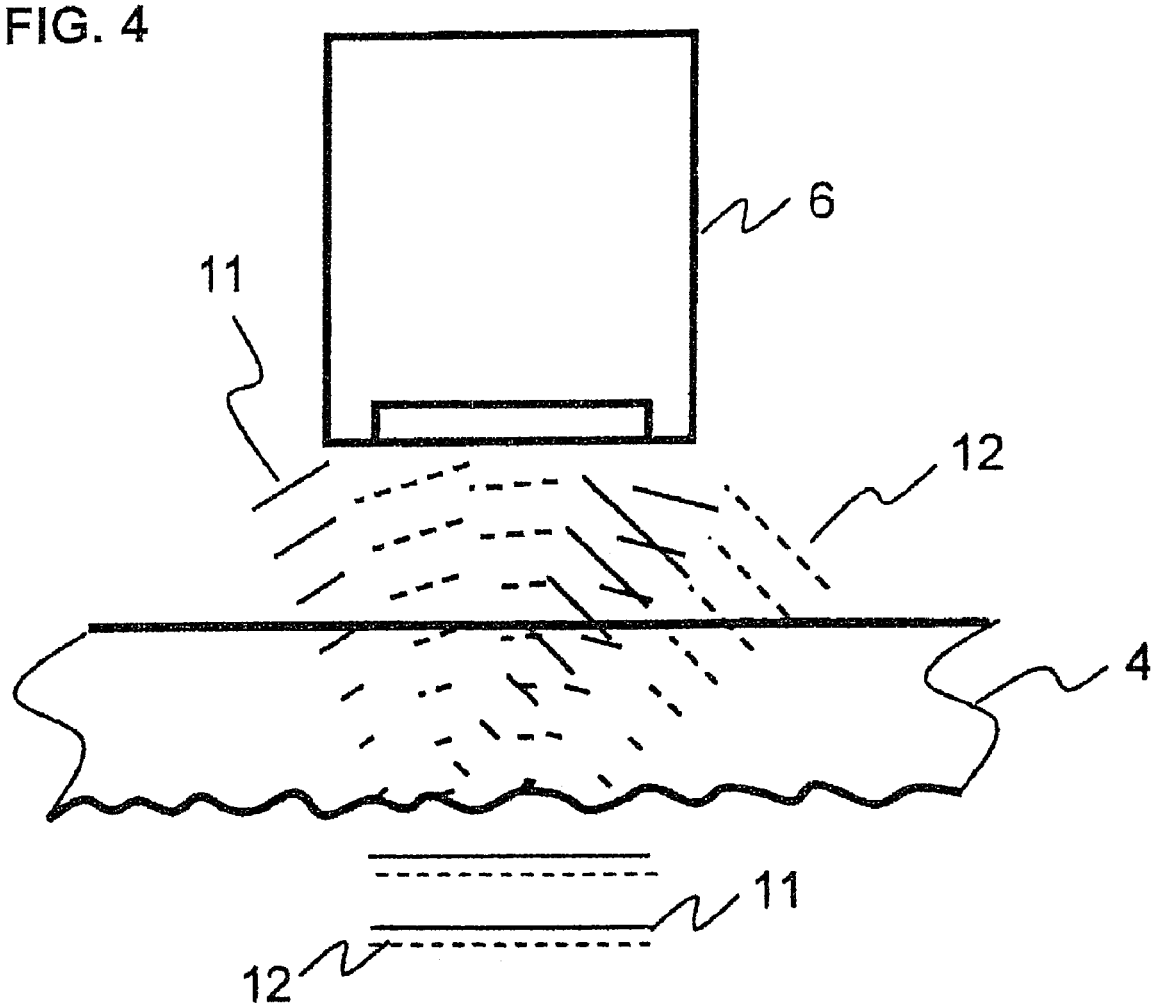
FIG. 4 is an explanatory view of the operation of a light scattering element according to the present invention.

FIG. 4 illustrates the effect of how the interference effect is suppressed by the uneven surface at the surface of the light scattering element 4. When the first reflected light A11 and the second reflected light B12 having phase differences becomes incident on the uneven surface formed to the light scattering element 4, the first reflected light A11 and the second reflected light B12 which are plane waves are scattered in various directions at various points of the uneven surface and are transmitted through the light scattering element 4. Interference is a phenomenon that can only be caused between the first reflected light A11 and the second reflected light B12 which are in a coherent state and having a specific phase difference. Therefore, as shown in typified form in FIG. 4, when the plane waves incident on respective portions on the surface of the light scattering element 4 are randomly scattered according to the directions of the uneven surface and transmitted through the light scattering element 4, the initial phase difference information of the first reflected light A11 and the second reflected light B12 is lost. Therefore, the transmitted light having passed through the light scattering element 4 reaches the photodetector 8 or the optical fiber light receiving unit 6 conducting light to the photodetector 8 without causing optical change due to phase synthesis. By this effect, it becomes possible to cancel the interference effect caused by the change in thickness of the thin film accompanying the plasma process and to detect only the change in emission quantity of light directly incident from the plasma even through observation from the opposite side from the surface of the sample to be processed having a thin-film structure.

Figure 5:
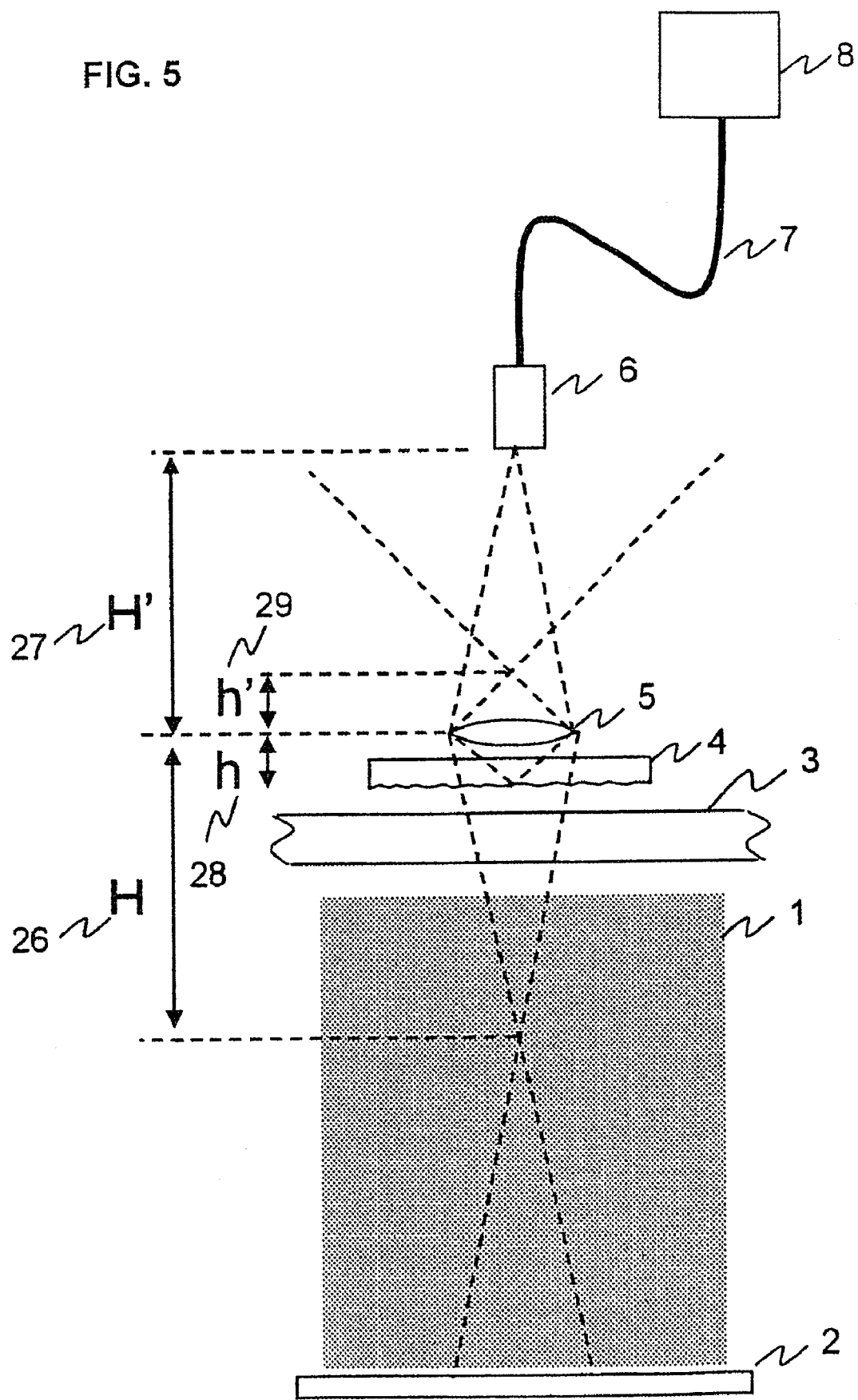
FIG. 5 is an explanatory view describing the effect of a convex lens according to the present invention.

Next, the effect of a convex lens 5 illustrated in FIG. 1 will be described with reference to FIG. 5. The essence of the present invention is the elimination of phase information between reflected lights in a coherent state by the light scattering element 4 described above. If the light scattering element 4 operates ideally, sufficient effect can be achieved solely by the light scattering element 4, but in practice, the influence of a screen effect at the surface of the light scattering element 4 occurs. There will be no problem if the first reflected light A11 and the second reflected light B12 are transmitted 100 percent through the light scattering element 4 while being scattered, but in some cases, a phase synthesis is caused on the surface of the light scattering element 4 and the surface of the light scattering element 4 acts as a screen, by which a light quantity change accompanying the change in film thickness occurs with the surface of the light scattering element 4 acting as a new light source. The convex lens 5 holds a function to reduce the influence of the interference effect assuming that the surface of the light scattering element 4 is a new light source reaching the photodetector 8.

We will now consider a case in which the light scattering element 4 is arranged at a position close to the convex lens 5 at the side facing the sample 2 to be processed. For example, the light scattering element 4 is arranged at a position sufficiently shorter (h28 of FIG. 5) than the focal length of the convex lens 5 (H26 and H'27 of FIG. 5). In this arrangement, the solid angle from the surface of the light scattering element 4 to the optical fiber light receiving unit 6 is reduced by the convex lens 5. In other words, the surface of the light scattering element 4 is blurred from the light receiving unit 6, and the percentage of the light from the surface of the light scattering element 4 reaching the light receiving surface is small. By relatively reducing the solid angle from the surface of the light scattering element 4 to the light receiving unit 6 than the solid angle from the plasma 1 to the light receiving unit 6, it becomes possible to utilize the photodetector 8 for observation while suppressing the influence of the change in light quantity accompanying the interference effect caused by the surface of the light scattering element 4 functioning as a new light source. By arranging the light scattering element 4 at a position closer toward the inner side (h28) than the focal length (H26, H'27) of the convex lens 5 so that the solid angle from the light receiving unit to the light scattering element 4 is one-third or smaller than the solid angle from the light receiving unit to the surface of the sample 2 to be processed, it becomes possible to practically suppress the influence of the interference effect caused by the light scattering element 4 functioning as a light source. In FIG. 5, reference h'29 denotes the imaging position of the light scattering element 4 by the convex lens 5.

Figure 6:
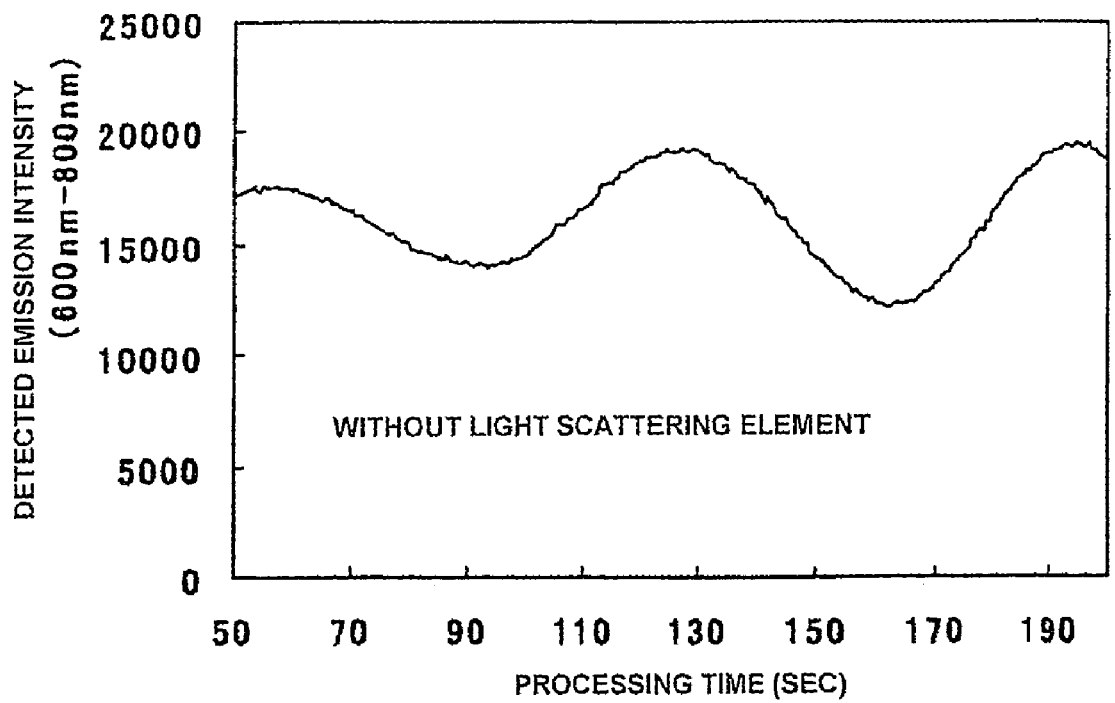
FIG. 6 shows result one of the evaluation on the effect of the present invention, showing the result of observing plasma emission without applying the present invention.
Figure 7:
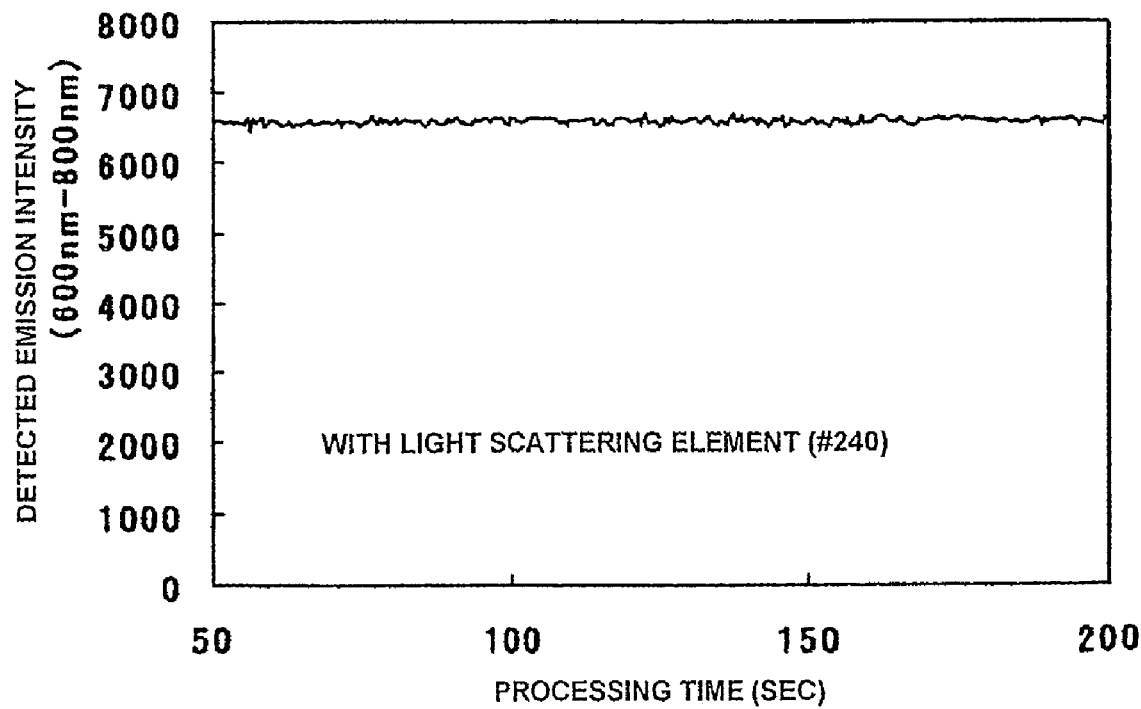
FIG. 7 shows result two of the evaluation on the effect of the present invention, showing the result of observing plasma emission using a #240 light scattering element.
Figure 8:
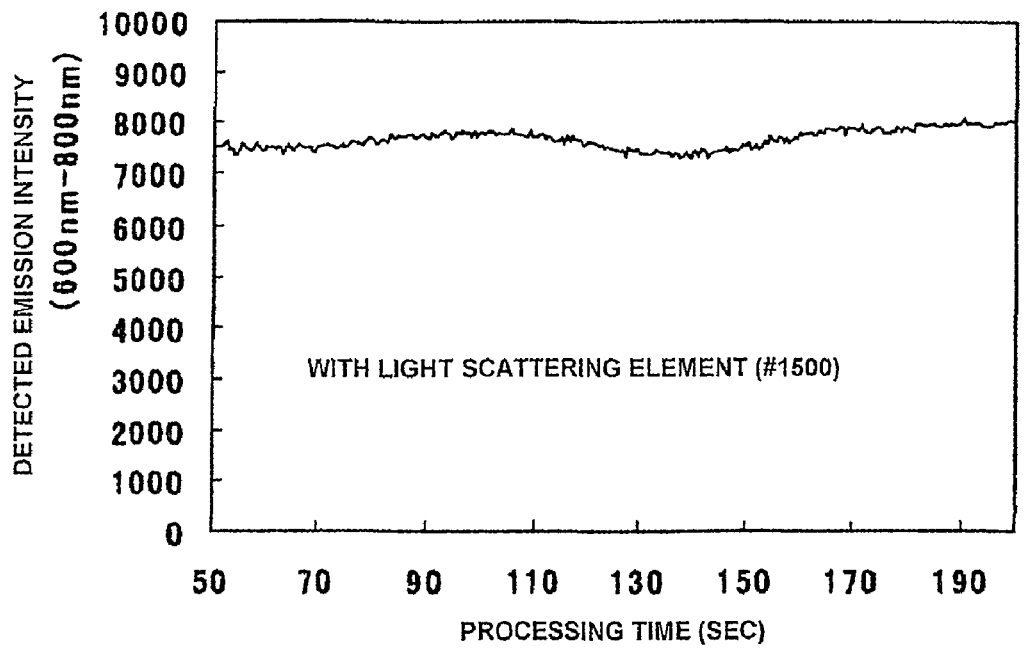
FIG. 8 shows result three of the evaluation on the effect of the present invention, showing the result of observing plasma emission using a #1500 light scattering element.

By the effects of the light scattering element 4 and the convex lens 5 described above, it becomes possible to conduct only the change in light quantity in the plasma efficiently to the photodetector 8, so as to detect plasma emission that is not influenced by the interference effect caused by the changes in the surface material of the sample 2 to be processed. FIGS. 6, 7 and 8 show the verification results of the effects of the present invention. FIG. 6 shows the result of observing the plasma emission accompanying the plasma processing from the opposite side from the sample 2 to be processed having a silicon oxide film 10 formed on a silicon substrate 9, without using the light scattering element according to the present invention. The vertical axis of FIG. 6 illustrates the average value of emission of wavelengths within the range of 600 nm to 800 nm, and the horizontal axis shows the plasma processing time. Since plasma is formed under a condition for etching a silicon oxide film, the processing time corresponds to the change in thickness of the silicon oxide film consumed through etching. It can be confirmed from FIG. 6 that when plasma emission is observed from the opposite side from the sample 2 to be processed without using the light scattering element 4, the change in emission quantity caused by the interference effect accompanying the change in silicon oxide film thickness is detected.

On the other hand, FIG. 7 shows the result of performing observation in a similar status as FIG. 6 but by arranging the light scattering element 4 and the convex lens 5 illustrated in FIG. 1. It can be confirmed that by the effect of the light scattering element 4 and the convex lens 5 described earlier, the absolute value of the light quantity being detected is reduced, but the change in light quantity caused by the interference effect is substantially cancelled. The light scattering element 4 used in FIG. 7 has an uneven surface formed using a #240 abrasive on the surface of a flat glass.

FIG. 8 shows the evaluation result of a similar status but through use of a light scattering element 4 having its uneven surface formed using a #1500 abrasive. In FIG. 8, the effect of the interference somewhat appears compared to FIG. 7. Therefore, it can be recognized that the effect of the present invention depends on the size of the uneven surface pitch of the light scattering element, and that an uneven surface created using an abrasive equal to or smaller than #1500 realizes an effective effect. The #240 abrasive has particle sizes distributed within the range of 60 to 127 $\mu$m (with an average particle size of 74 to 84 $\mu$m). On the other hand, the #1500 abrasive has particle sizes distributed within the range of 6 to 36 $\mu$m (with an average particle size of 11 to 13 $\mu$m). Since the uneven surface pitch of the light scattering element is close to the particle size of the abrasive, the minimum uneven surface pitch effective in the present invention is approximately 5 $\mu$m. On the other hand, it is considered that sufficient effect is achieved by a maximum uneven surface pitch equal to or greater than the maximum particle size of the #240 abrasive, but if the uneven surface pitch is too large, the scattering angle of light becomes too large, and it becomes difficult to introduce a sufficient light quantity into the photodetector. Therefore, it is considered that the most suitable maximum pitch of the uneven surface of the light scattering element is approximately 200 $\mu$m.

FIGS. 6, 7 and 8 have shown that the effect of the present invention can be realized by using a light scattering element having an uneven surface of 5 to 200 $\mu$m, but if the surface roughness within that pitch has a roughness with an optical influence, the effect of the present invention cannot be exerted fully due to the aforementioned screen effect. Actually, the unevenness has a pitch of 5 to 200 $\mu$m, but the surface roughness within that pitch must be shorter than the detected wavelength, preferably of a roughness equal to or smaller than 0.1 $\mu$m. When quartz is used as the light scattering element, a light with a wavelength of approximately 0.2 $\mu$m or greater is transmitted, so that if the surface roughness is equal to or smaller than ½ the transmission wavelength, it will not function as a screen. Therefore, an effective surface roughness within the uneven surface of 5 to 200 $\mu$m is equal to or smaller than 0.1 $\mu$m.

The present embodiment utilizes a light scattering element 4 having an uneven surface formed to a flat glass using an abrasive having given particle sizes, but similar effects can be realized using a commercially-available light transmission means such as a holographic diffuser with an adjusted light diffusion angle.

FIG. 1 utilizes a vacuum partition window 3. The vacuum partition window functions to prevent the light scattering element 4 from being exposed to plasma directly and altered thereby. The vacuum partition window 3 is formed of a light transmission member such as an optically flat quart. Of course, the same effects as the present embodiment can be realized in an arrangement in which the light scattering element 4 is directly exposed to plasma, but in order to maintain the effect, it is necessary to closely observe the changes in condition of the light scattering element caused by plasma.

In the embodiment of FIG. 1, a light scattering element 4 and a convex lens 5 are disposed at a front stage of the optical fiber light receiving unit 6, so that light having removed the influence of interference effect is introduced via the optical fiber 7 to the photodetector 8, but the same effect can be achieved by excluding the optical fiber 7 and arranging the light scattering element 4 and the convex lens 5 directly at the front stage of the photodetector 8.

Embodiment 2

Figure 9:
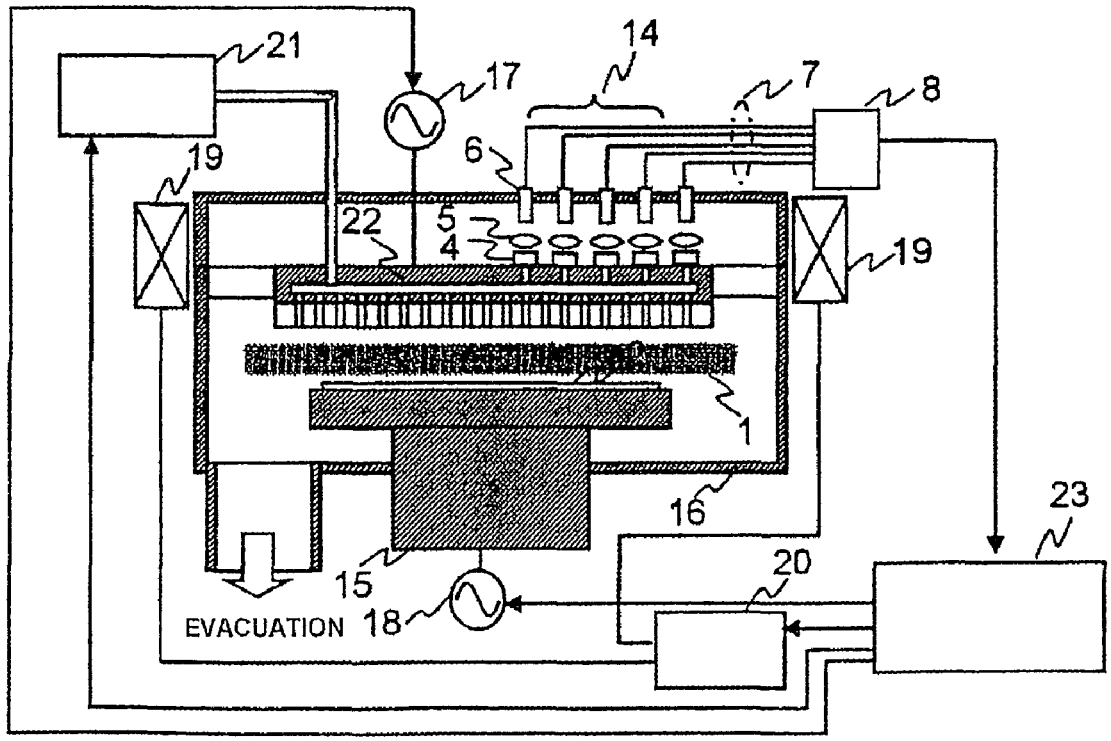
FIG. 9 shows a second preferred embodiment of the present invention.

FIG. 9 shows the configuration of embodiment 2 according to the present invention. FIG. 9 shows the configuration of an apparatus having a plurality of sets of plasma emission detecting means 14 composed of a light scattering element 4, a convex lens 5, an optical fiber light receiving unit 6 and an optical fiber 7 having a basic structure illustrated in FIG. 1 arranged on a plane opposing to the sample 2 to be processed, so as to observe the change in plasma space distribution of plasma emission distribution on the surface of the sample 2 to be processed.

In the plasma processing apparatus of the present embodiment, reference numbers 1 through 8 denote the same components as FIG. 1. The plasma processing apparatus comprises a plasma emission detecting means 14, a sample staging means 15, a vacuum reactor 16, a high frequency power supply 17 for generating discharge, a high frequency power supply 18 to be applied on the sample, a magnetic field generating coil 19, a direct current power supply 20 for the magnetic field generating coil, a material gas introducing means 21, an upper electrode 22 for discharge, and a control unit 23. According to the configuration of FIG. 9, it becomes possible to observe the stability of plasma distribution, so as to output a warning of processing status error such as when the plasma distribution is shifted by some cause from a given constant status, or to stabilize the status by performing feedback to plasma generating parameters, such as the high frequency power for discharge, the high frequency power applied to the sample, the magnetic field for controlling plasma generation, the flow rate of material gas and the pressure of material gas, in response to the status change. This operation enables to improve the reproducibility of processing accuracy in plasma etching and the like which demands a highly accurate processing. By applying the structure of FIG. 1 which is the basic structure of the present invention to the apparatus configuration of FIG. 9, it becomes possible to observe the genuine plasma emission quantity and its distributions without depending on the surface status of the substrate 2 to be processed, and it becomes possible to improve the accuracy of stability control of plasma.

Embodiment 3

Figure 10:
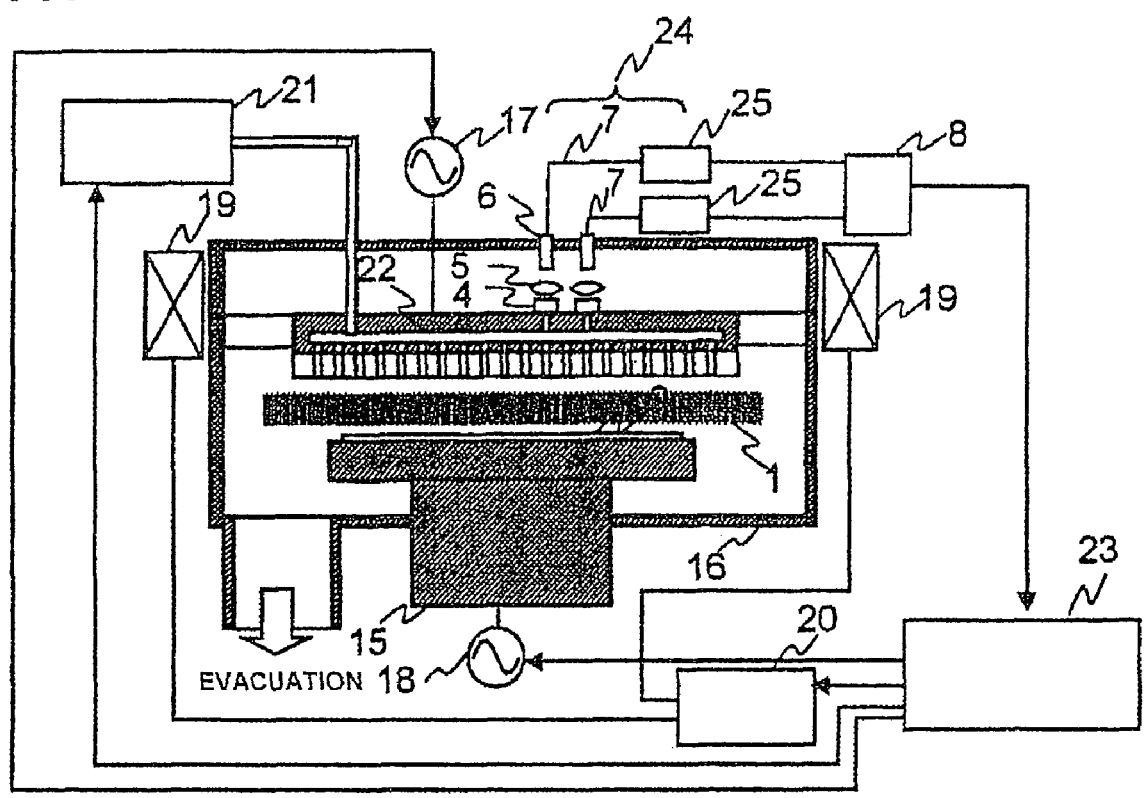
FIG. 10 shows a third preferred embodiment of the present invention.

FIG. 10 shows an arrangement of embodiment 3 according to the present invention. In FIG. 10, the plasma processing apparatus according to embodiment 3 of the present invention utilizes one or two plasma emission detecting means 24 having a basic structure as illustrated in FIG. 1 to observe light emission of active species existing in the plasma generated by the reaction between the sample to be processed and the plasma from the opposite side from the sample to be processed. Reference numbers 1 through 8 and 15 through 23 refer to the same components as embodiment 2. In order to observe the emission of the active species, the plasma processing apparatus according to the present embodiment has a spectroscope 25 arranged in a front stage of the photodetector 8 at a rear stage of the plasma emission detecting means 24, so that through spectroscopic analysis, the active species within the plasma can be monitored. By monitoring the status of active species generated by the reaction between the sample 2 to be processed and the plasma, it becomes possible to detect the end point of processes such as the etching process.

By using one or two plasma emission detecting means 24 to observe active species having different wavelengths and to detect the time variation of differences or ratio thereof, it becomes possible to accurately determine the status of the etching process. Of course, the end point of etching can also be determined based on the time variation of a single wavelength corresponding to an active species of a certain property. Since excessive etching process or insufficient etching process influences the etching profile significantly, it is extremely important to determine the etching end point accurately in order to improve processing accuracy. In the prior art, accurate determination was difficult since the interference effect accompanying the changes in film thickness of resist and the like on the surface of the sample to be processed affected the detected emission intensity when detection was performed from the opposite side from the sample to be processed. One method to prevent this drawback was to observe the sample to be processed from a direction parallel to the plane of the sample, but according to this method, the influence of the vacuum reactor wall could not be eliminated, and in many cases, it is more preferable to perform observation from a position opposing to the surface of the sample in order to detect reaction products vaporizing from the surface of the sample with high sensitivity. Therefore, through use of the present invention, it has become possible to observe the active species within the plasma from the opposite side from the sample 2 to be processed highly sensitively by eliminating the effect of optical variation accompanying the changes in surface status of the sample 2 to be processed. By this effect of the present invention, it becomes possible to improve the accuracy and reproducibility of the end point determination of the etching process, and thus, it becomes possible to realize improved processing accuracy.

What is claimed is:

1. A plasma processing apparatus for turning a gas supplied to a vacuum reactor into plasma and etching a surface of a sample to be processed placed in the vacuum reactor by the plasma, the apparatus comprising:
   a vacuum reactor;
   a vacuum evacuation means for evacuating the interior of the vacuum reactor;
   a sample stage means disposed in the vacuum reactor for placing a sample to be processed;
   a material gas introducing means for introducing material gas into the vacuum reactor;
   a plasma generating means for turning the gas introduced via the material gas introducing means into plasma; and
   a plasma emission detecting means disposed at a plane opposing to the sample to be processed, wherein the plasma emission detecting means further comprises;
      an emission extraction means for extracting the emission from plasma;
      a light transmission means located outside of the vacuum reactor for scattering and transmitting incident light into the emission extraction means; and
      a vacuum partition window configured to prevent the light transmission means from being directly exposed to the plasma, wherein the light transmission means of the plasma emission detecting means is comprised of a light scattering means having an uneven surface of Ra 5 μm or greater and Ra 200 μm or smaller, for scattering and transmitting incident light of 0.2 μm or greater in wavelength; wherein the uneven surface of the light scattering means is obtained by applying an abrasive to the surface of the light scattering means.

2. The plasma processing apparatus according to claim 1, wherein
the plasma emission detecting means has arranged either directly or via an optical fiber on a rear stage of the light transmission means a converting means for converting light into an electric signal.

3. The plasma processing apparatus according to claim 1, wherein
the emission extraction means has arranged a convex lens adjacent to the light transmission means.

4. The plasma processing apparatus according to claim 1, wherein
the plasma emission detecting means comprises a converting means for converting light from the sample to be processed into an electric signal, the converting means disposed either directly or via an optical fiber on a rear stage of the light transmission means; and
a convex lens is disposed adjacent to the light transmission means, wherein the convex lens is arranged so that a solid angle between the convex lens and the converting means or a light receiving end plane of the optical fiber arranged at a rear stage of the light transmission means is equal to or greater than three times a solid angle between the light scattering means for scattering and transmitting incident light or the light scattering means and the converting means or the light receiving end plane of the optical fiber.

5. The plasma processing apparatus according to claim 1, wherein
the plasma emission detecting means comprises the light transmission means comprised of either a light scattering means for scattering and transmitting incident light or the light scattering means, and an optical transmission member disposed between the light transmission means and the sample to be processed.

6. The plasma processing apparatus according to claim 1, wherein
the plasma emission detecting means comprises a plurality of emission extraction means for extracting the emission from plasma and a plurality of converting means for converting the emission of plasma obtained by the emission extraction means to electric signals; and
the emission obtained by the plurality of emission extraction means is respectively introduced to the converting means and converted to electric signals, and plasma emission intensity distribution is measured based on the electric signals so as to evaluate a space distribution status of plasma on the processing surface.

7. The plasma processing apparatus according to claim 1, wherein
the plasma emission detecting means comprises an emission extraction means for extracting the emission from plasma, a spectroscope, and a progress status measuring means for measuring the status of progress of the etching process on the surface of the sample to be processed by measuring distribution of plasma emission, wherein the emission obtained via the emission extraction means is introduced to the spectroscope and subjected to plasma emission spectroscopic measurement so as to measure the etching status of the surface of the sample to be processed.

8. The plasma processing apparatus according to claim 7, wherein
the progress status measuring means detects an end point of processing status based on the change in plasma emission species caused by the reaction between the surface of the sample to be processed and plasma.

9. The plasma processing apparatus according to claim 1, wherein
the plasma emission detecting means comprises a plurality of emission extraction means for extracting the emission from plasma, a plurality of spectroscopes and a plurality of converting means for converting the emission of plasma obtained by the emission extraction means to electric signals, and a progress status measuring means for measuring the status of progress of the etching process on the surface of the sample to be processed, wherein the emission obtained via the plurality of emission extraction means is introduced to the converting means and converted into electric signals, and the plasma emission intensity distribution is measured based on the electric signals, according to which the time variation of spatial distribution of plasma is measured, and a plasma generating parameter is controlled in response to the variation.

10. The plasma processing apparatus according to claim 9, wherein
the plasma generating parameter controlled in response to the time variation of spatial distribution of plasma obtained via the plurality of emission extraction means is selected from a group consisting of a high frequency power for generating plasma, a magnetic field condition for generating plasma, a gas pressure or a high frequency power applied to the sample to be processed.

11. The plasma processing apparatus according to claim 1, wherein the vacuum partition window is comprised of optically flat quartz.

12. A plasma processing apparatus for turning a gas supplied to a vacuum reactor into plasma and etching a surface of a sample to be processed placed in the vacuum reactor by the plasma, the apparatus comprising:
a vacuum reactor;
an vacuum evacuation means for evacuating the interior of the vacuum reactor;
a sample stage means disposed in the vacuum reactor for placing a sample to be processed;
a material gas introducing means for introducing material gas into the vacuum reactor;
a plasma generating means for turning the gas introduced via the material gas introducing means into plasma; and
a plasma emission detecting means disposed at a plane opposing to the sample to be processed, wherein the plasma emission detecting means further comprises:
an emission extraction means for extracting the emission from plasma;
a light transmission means located outside of the vacuum reactor for scattering and transmitting incident light into the emission extraction means; and
means for preventing the light transmission means from being altered by the plasma by preventing the light transmission means from being directly exposed to the plasma,
wherein the light transmission means of the plasma emission detecting means is comprised of a light scattering means having an uneven surface of Ra 5 μm or greater and Ra 200 µm or smaller, for scattering and transmitting incident light of 0.2 µm or greater in wavelength; wherein the uneven surface of the light scattering means is obtained by applying an abrasive to the surface of the light scattering means.

13. The plasma processing apparatus according to claim 12, wherein
the plasma emission detecting means has arranged either directly or via an optical fiber on a rear stage of the light transmission means a converting means for converting light into an electric signal.

14. The plasma processing apparatus according to claim 12, wherein
the emission extraction means has arranged a convex lens adjacent to the light transmission means.

15. The plasma processing apparatus according to claim 12, wherein
the plasma emission detecting means comprises a converting means for converting light from the sample to be processed into an electric signal, the converting means disposed either directly or via an optical fiber on a rear stage of the light transmission means;
a convex lens is disposed adjacent to the light transmission means, wherein the convex lens is arranged so that a solid angle between the convex lens and the converting means or a light receiving end plane of the optical fiber arranged at a rear stage of the light transmission means is equal to or greater than three times a solid angle between the light scattering means for scattering and transmitting incident light or the light scattering means and the converting means or the light receiving end plane of the optical fiber.

16. The plasma processing apparatus according to claim 12, wherein
the plasma emission detecting means comprises the light transmission means comprised of either a light scattering means for scattering and transmitting incident light or the light scattering means, and an optical transmission member disposed between the light transmission means and the sample to be processed.

17. The plasma processing apparatus according to claim 12, wherein
the plasma emission detecting means comprises a plurality of emission extraction means for extracting the emission from plasma and a plurality of converting means for converting the emission of plasma obtained by the emission extraction means to electric signals; and
the emission obtained by the plurality of emission extraction means is respectively introduced to the converting means and converted to electric signals, and plasma emission intensity distribution is measured based on the electric signals so as to evaluate a space distribution status of plasma on the processing surface.

18. The plasma processing apparatus according to claim 12, wherein
the plasma emission detecting means comprises an emission extraction means for extracting the emission from plasma, a spectroscope, and a progress status measuring means for measuring the status of progress of the etching process on the surface of the sample to be processed by measuring distribution of plasma emission, wherein the emission obtained via the emission extraction means is introduced to the spectroscope and subjected to plasma emission spectroscopic measurement so as to measure the etching status of the surface of the sample to be processed.

19. The plasma processing apparatus according to claim 18, wherein
the progress status measuring means detects an end point of processing status based on the change in plasma emission species caused by the reaction between the surface of the sample to be processed and plasma.

20. The plasma processing apparatus according to claim 12, wherein
the plasma emission detecting means comprises a plurality of emission extraction means for extracting the emission from plasma, a plurality of spectroscopes and a plurality of converting means for converting the emission of plasma obtained by the emission extraction means to electric signals, and a progress status measuring means for measuring the status of progress of the etching process on the surface of the sample to be processed, wherein the emission obtained via the plurality of emission extraction means is introduced to the converting means and converted into electric signals, and the plasma emission intensity distribution is measured based on the electric signals, according to which the time variation of spatial distribution of plasma is measured, and a plasma generating parameter is controlled in response to the variation.

21. The plasma processing apparatus according to claim 20, wherein
the plasma generating parameter controlled in response to the time variation of spatial distribution of plasma obtained via the plurality of emission extraction means is selected from a group consisting of a high frequency power for generating plasma, a magnetic field condition for generating plasma, a gas pressure or a high frequency power applied to the sample to be processed.

* * * * *